(12) United States Patent
Kang

(10) Patent No.: US 6,992,912 B2
(45) Date of Patent: Jan. 31, 2006

(54) NONVOLATILE FERROELECTRIC MEMORY DEVICE HAVING TIMING REFERENCE CONTROL FUNCTION AND METHOD FOR CONTROLLING THE SAME

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 135 days.

(21) Appl. No.: 10/737,757

(22) Filed: Dec. 18, 2003

(65) Prior Publication Data
US 2004/0257851 A1 Dec. 23, 2004

(30) Foreign Application Priority Data
Jun. 17, 2003 (KR) .................. 10-2003-0039145

(51) Int. Cl.
G11C 11/22 (2006.01)

(52) U.S. Cl. ................... 365/145; 365/207; 365/189.05
(58) Field of Classification Search ................. 365/145, 365/207, 189.05
See application file for complete search history.

(56) References Cited

U.S. PATENT DOCUMENTS

| | | | |
|---|---|---|---|
| 6,067,244 A | 5/2000 | Ma et al. | |
| 6,272,594 B1 | 8/2001 | Gupta et al. | |
| 6,301,145 B1 | 10/2001 | Nishihara | |
| 6,314,016 B1 | 11/2001 | Takasu | |
| 6,363,439 B1 | 3/2002 | Battles et al. | |
| 6,449,197 B1 * | 9/2002 | Hiraki et al. | 365/189.05 |
| 6,728,128 B2 * | 4/2004 | Nishimura et al. | 365/145 |
| 6,870,785 B1 * | 3/2005 | Kang | 365/233 |

FOREIGN PATENT DOCUMENTS

KR   1020040059009 A   7/2004

* cited by examiner

Primary Examiner—Anh Phung
Assistant Examiner—Tuan T. Nguyen
(74) Attorney, Agent, or Firm—Heller Ehram LLP

(57) ABSTRACT

A nonvolatile ferroelectric memory device amplifies a sensing voltage level of cell data with a CMOS threshold voltage reference in a main bitline, and decides cell data when a reference timing strobe is applied on a basis of a time axis. In a read mode, read data applied from a cell array block are stored in a read/write data register array unit through a common data bus unit. In a write mode, read data stored in the read/write data register array unit or input data applied from a read/write data buffer unit are stored in a cell array block through the common data bus unit. As a result, a sensing voltage of cell data is determined on a basis of the time axis, thereby improving a sensing margin.

20 Claims, 15 Drawing Sheets

NONVOLATILE FERROELECTRIC MEMORY DEVICE HAVING TIMING REFERENCE CONTROL FUNCTION AND METHOD FOR CONTROLLING THE SAME

BACKGROUND OF THE INVENTION

1. Field of the Invention

The present invention generally relates to a nonvolatile ferroelectric memory device having a timing reference control function, and a method for controlling the same, and more specifically, to a technology which improves cell operation characteristics by controlling a sensing operation of a nonvolatile ferroelectric memory device by a timing reference.

2. Description of the Prior Art

Generally, a ferroelectric random access memory (hereinafter, referred to as 'FRAM') has attracted considerable attention as next generation memory device because it has a data processing speed as fast as a Dynamic Random Access Memory DRAM and conserves data even after the power is turned off.

The FRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FRAM are disclosed in the Korean Patent Application No. 2002-85533 by the same inventor of the present invention. Therefore, the basic structure and the operation on the FRAM are not described herein.

In the conventional nonvolatile ferroelectric memory, when cell data are sensed, a sensing reference voltage is set to have a proper level.

However, as a chip operation voltage of the FeRAM becomes lower, the level of the reference voltage to sense a cell also becomes lower. When the sensing voltage level of the cell data is low, a voltage margin between the sensing voltage and the reference voltage is reduced. As a result, it is difficult to determine data. Also, a sensing margin is reduced by change of the reference voltage. Therefore, it is difficult to obtain a rapid operation speed of the FeRAM chip having a 1T1C (1transistor, 1capacitor).

SUMMARY OF THE INVENTION

Accordingly, it is an object of the present invention to embody a chip having an improved data access time by reading/writing data through a common data bus unit and storing the read/written data through a register.

It is another object of the present invention to secure the margin of a sensing voltage and improve the operation speed in the embodiment of a chip having a low voltage or a rapid access time by amplifying a self-sensing voltage of cell data in a reference timing interval and judging a voltage level of data on a basis of a time axis.

In an embodiment, a nonvolatile ferroelectric memory device having a timing reference control function comprises a plurality of cell array blocks, a read/write data register array unit and a common data bus unit. The plurality of cell array blocks amplify a sensing voltage of cell data in a reference timing strobe interval on a basis of a logic threshold voltage. Each of the plurality of cell array blocks comprises a nonvolatile ferroelectric memory. The read/write data register array unit stores read data applied from the plurality of cell array blocks when a read lock control signal is activated, and stores the read data or input data written in the plurality of cell array blocks when a write lock control signal is activated. The common data bus unit, connected in common to the plurality of cell array blocks, exchanges the read data or the input data between the plurality of cell array blocks and the read/write data register array unit.

In another embodiment, a nonvolatile ferroelectric memory device having a timing reference control function comprises a plurality of cell array blocks, a common data bus unit and a read/write data register array unit. The common data bus unit is connected in common to the plurality of cell array blocks. The read/write data register array unit stores read data applied from the plurality of cell array blocks through the common data bus unit, and stores input data to be written in a plurality of cell array blocks through the common data bus unit. Each cell array block comprises a sense amplifier array unit for converting a self-sensing voltage of cell data on a predetermined time axis, and amplifying a voltage level of the cell data using a threshold value of a logic threshold voltage for a reference timing strobe interval.

In still another embodiment, a nonvolatile ferroelectric memory device having a timing reference control function comprises a plurality of cell array blocks, a common data bus unit and a read/write data register array unit. The common data bus unit is connected in common to the plurality of cell array blocks. The read/write data register array unit stores read data applied from the plurality of cell array blocks through the common data bus unit, and stores input data to be written in a plurality of cell array blocks through the common data bus unit. Here, the read/write data register array unit comprises a bus pull-up unit, a read bus switch unit, a data input switch unit, a data latch unit, a write bus switch unit and a data output switch unit. The bus pull-up unit pulls up the common data bus unit from an initial state in response to a bus pull-up control signal. The read bus switch unit selectively outputs the read data in response to a read lock control signal. The data input switch unit selectively outputs the input data applied from a data buffer bus unit in response to a write lock control signal. The data latch unit stores the read data and the input data. The write bus switch unit outputs the input data or read data stored in the data latch unit in response to a write enable signal. The data output switch unit outputs read data stored in the data latch unit into the data buffer bus unit in response to an output enable signal.

In still another embodiment, a nonvolatile ferroelectric memory device having a timing reference control function comprises a level sensing unit, a sensing buffer unit and a sensing output unit. The level sensing unit amplifies a sensing voltage level of cell data high of the main bitline when a sensing enable signal is enabled and a sensing voltage of a main bitline is below a predetermined threshold value. The sensing buffer unit buffers an output voltage of the level sensing unit. The sensing output unit determines a voltage level of read data read from a nonvolatile ferroelectric memory through a common data bus unit depending on an output voltage of the sensing buffer unit when a sensing output enable signal is enabled.

In an embodiment, there is provided a method for controlling a nonvolatile ferroelectric memory having a timing reference control function, the memory comprising a plurality of cell array blocks and a read/write data register array unit for storing data read/written in the plurality of cell array blocks through a common data bus unit connected in common to the plurality of cell array blocks. The method comprises the steps of: sensing a voltage level of cell data applied from main bitlines of the plurality of cell array blocks; amplifying a voltage level of the cell data when the voltage level of the cell data reaches below a sensing critical voltage, and outputting the amplified voltage into the common data bus unit; and sensing a voltage level of the amplified voltage on a predetermined time axis for a reference timing strobe interval, and storing an effective value of cell data depending on sensed levels.

DETAILED DESCRIPTION OF THE PREFERRED EMBODIMENTS

The present invention will be described in detail with reference to the accompanying drawings.

Figure 1:
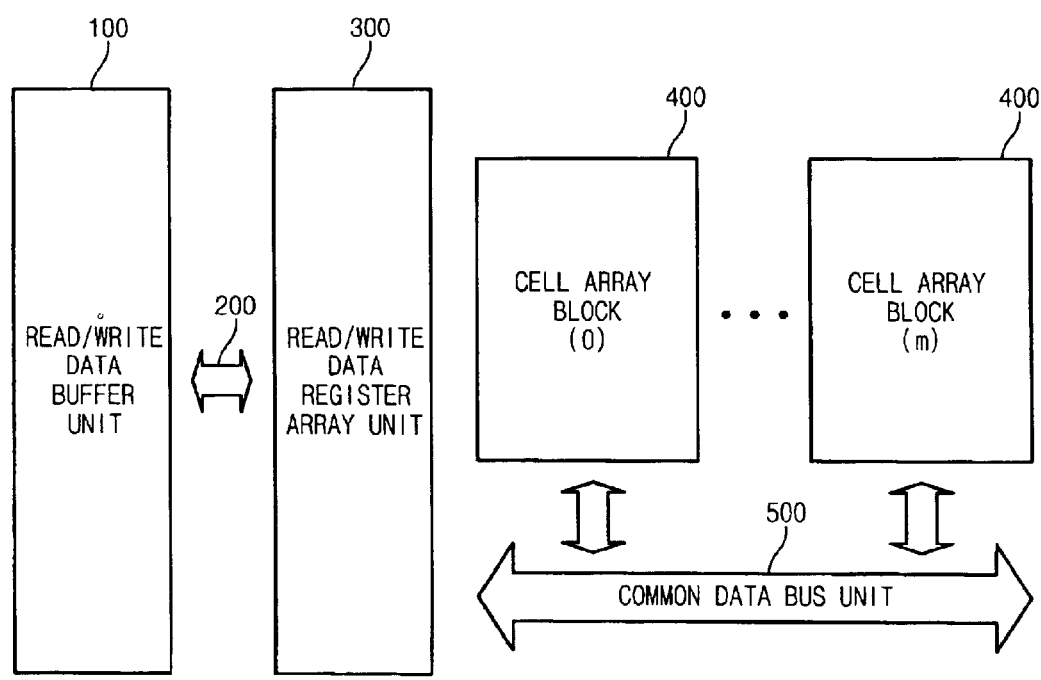
FIG. 1 is a diagram of a nonvolatile ferroelectric memory device having a timing reference control function according to a first embodiment of the present invention.

FIG. 1 is a diagram of a nonvolatile ferroelectric memory device having a timing reference control function according to a first embodiment of the present invention.

In a first embodiment, the nonvolatile ferroelectric memory device comprises a read/write data buffer 100, a data buffer bus unit 200, a read/write data register array unit 300, a plurality of cell array blocks 400 and a common data bus unit 500.

The read/write data buffer 100 is connected to the read/write data register array unit 300 through the data buffer bus unit 200. The plurality of cell array blocks 400 share the common data bus unit 500. The common data bus unit 500 is connected to the read/write data register array 300.

In a read mode, data read from the cell array block 400 are stored in the read/write data register array unit 300 through the common data bus unit 500. Read data stored in the read/write data register array unit 300 are outputted into the read/write data buffer unit 100 through the data buffer bus unit 200.

However, in a write mode, input data inputted through the read/write data buffer unit 100 are stored in the read/write data register array unit 300 through the data buffer bus unit 200. The input data or read data stored in the read/write data register array unit 300 are written in the cell array block 400 through the common data bus unit 500.

Figure 2:
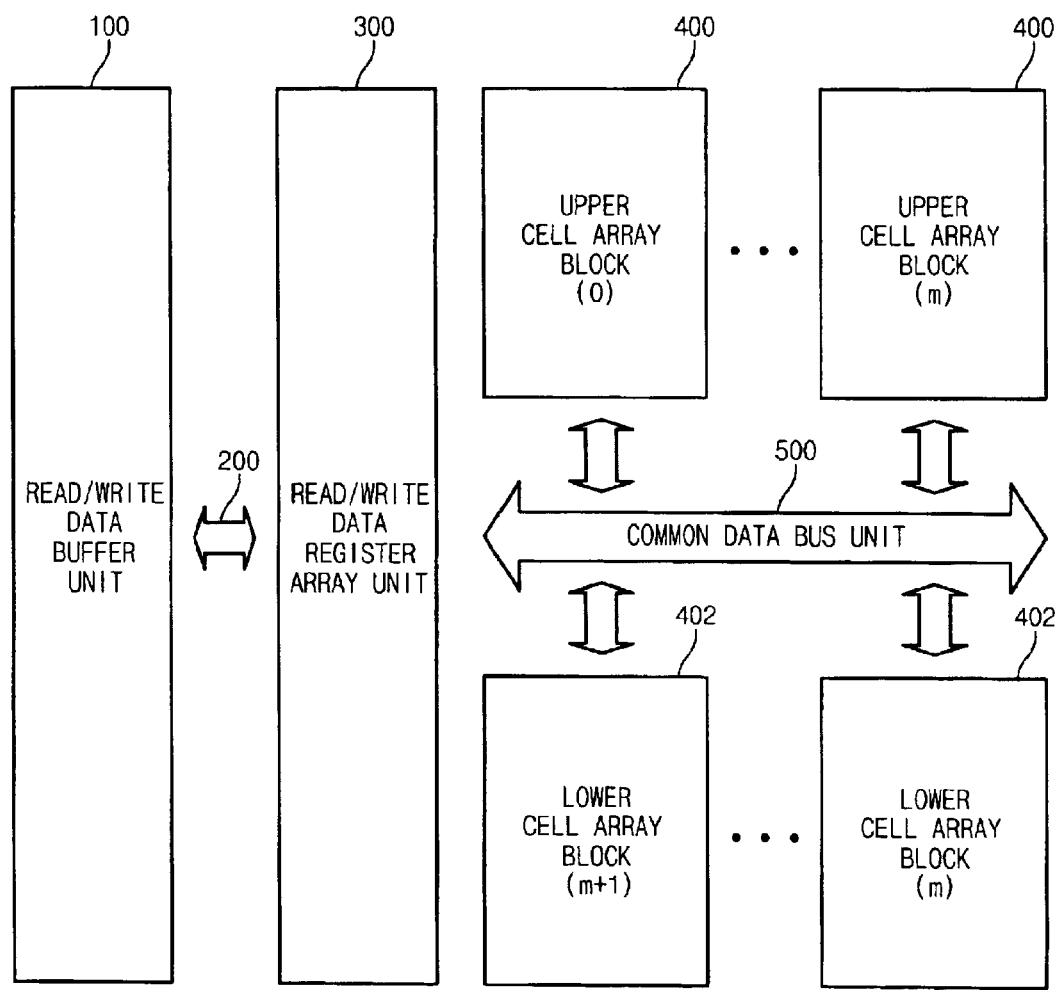
FIG. 2 is a diagram of a nonvolatile ferroelectric memory device having a timing reference control function according to a second embodiment of the present invention.

FIG. 2 is a diagram of a nonvolatile ferroelectric memory device having a timing reference control function according to a second embodiment of the present invention.

In a second embodiment, the nonvolatile ferroelectric memory device comprises a read/write data buffer unit 100, a data buffer bus unit 200, a read/write data register array unit 300, a plurality of upper cell array blocks 400, a plurality of lower cell array blocks 402 and a common data bus unit 500. Here, the common data bus unit 500 is shared by the upper cell array blocks 400 and the lower cell array blocks 402.

The read/write data buffer unit 100 is connected to the read/write data register array unit 300 through the data buffer bus unit 200. The common data bus unit 500 is connected to the read/write data register array unit 300.

In the read mode, read data outputted from the upper cell array block 400 or the lower cell array block 402 are stored in the read/write data register array unit 300 through the common data bus unit 500. Read data stored in the read/write data register array unit 300 are outputted into the read/write data buffer unit 100 through the data buffer bus unit 200.

On the other hand, in the write mode, input data inputted through the read/write data buffer unit 100 are stored in the read/write data register array unit 300 through the data buffer bus unit 200. Input data stored in the read/write data register array unit 300 are written in the upper cell array block 400 or the lower cell array block 402 through the common data bus unit 500. Here, the read data stored in the read/write data register array unit 300 may be restored in the upper cell array block 400 or the lower cell array block 402.

Figure 3:
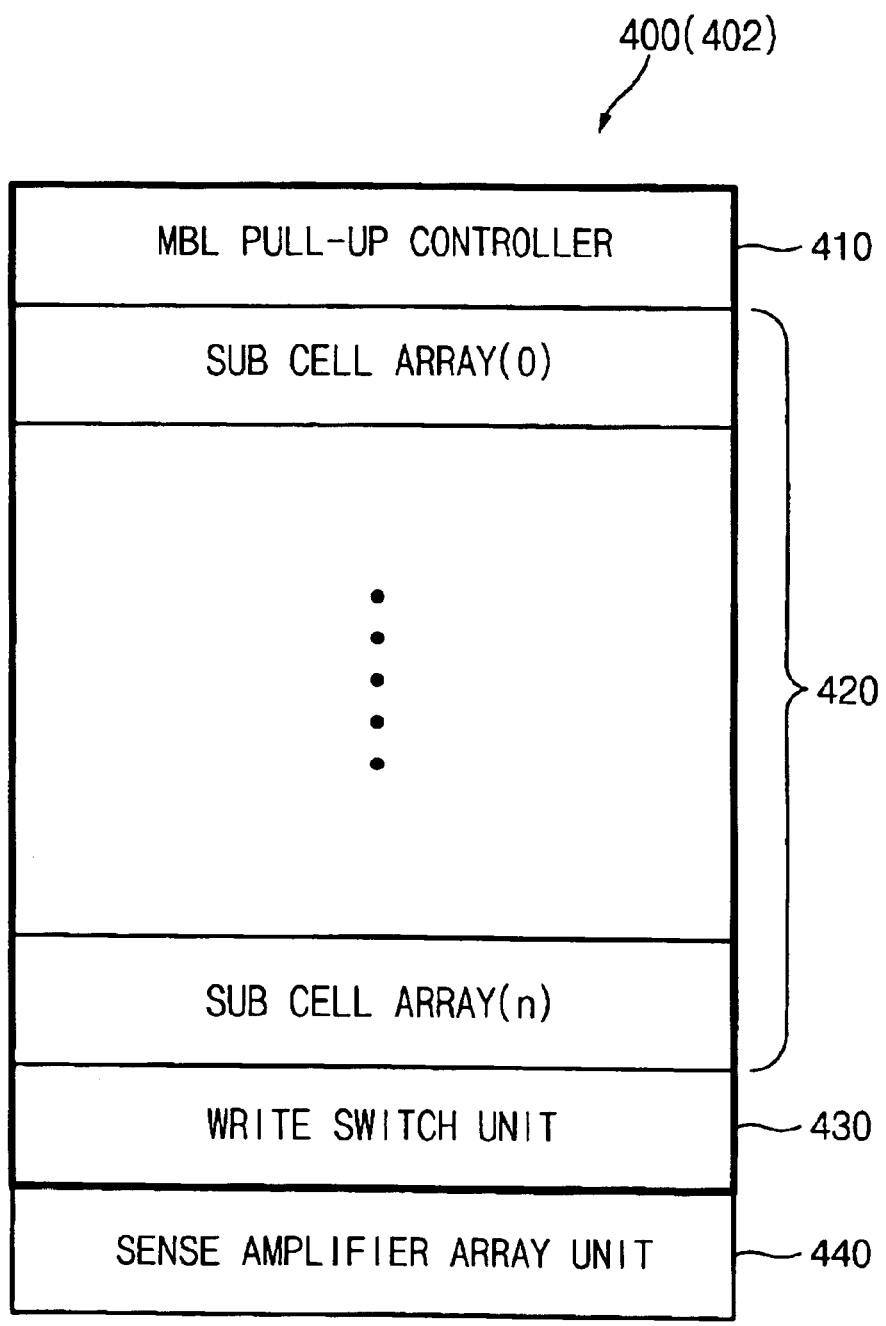
FIG. 3 is a diagram illustrating a cell array block according to an embodiment of the present invention.

FIG. 3 is a diagram illustrating the cell array block 400 or 402 according to an embodiment of the present invention.

In FIG. 3, the upper cell array block 400 is exemplified because it has the same structure as that of the lower cell array block 402.

The cell array block 400 comprises a main bitline (MBL) pull-up controller 410, a plurality of sub cell arrays 420, a write switch unit 420 and a sense amplifier array unit 440. Here, the sense amplifier array unit 440 is connected to the common data bus unit 500.

Figure 4:
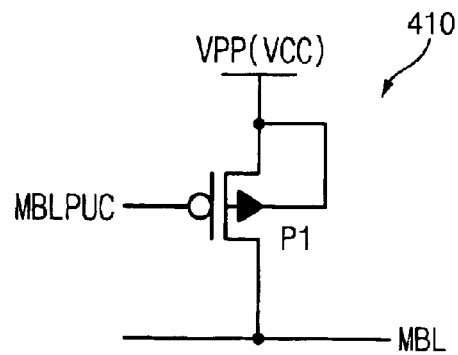
FIG. 4 is a circuit diagram of a MBL pull-up controller of FIG. 3.

FIG. 4 is a circuit diagram of the MBL pull-up controller 410 of FIG. 3.

The main bitline pull-up controller 410 comprises a PMOS transistor P1 for pulling up a main bitline MBL in a precharge mode. The PMOS transistor P1 has a source connected to a power voltage VCC (or VPP) terminal, a drain connected to the main bitline MBL and a gate to receive a main bitline pull-up control signal MBLPUC.

Figure 5:
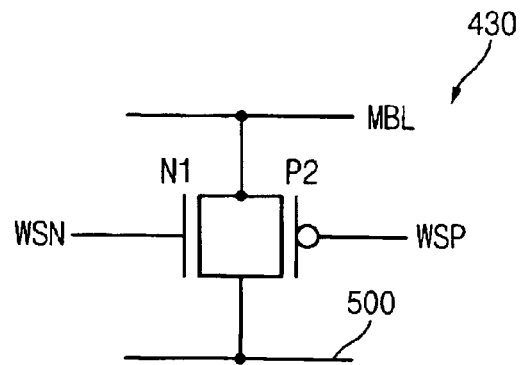
FIG. 5 is a circuit diagram of a write switch unit of FIG. 3.

FIG. 5 is a circuit diagram of a write switch unit 430 of FIG. 3.

The write switching unit 430 comprises an NMOS transistor N1 and a PMOS transistor P2. The NMOS transistor N1, connected between the main bitline MBL and the common data bus unit 500, has a gate to receive the write switch control signal WSN. The PMOS transistor P2, connected between the main bitline MBL and the common data bus unit 500, has a gate to receive a write switch control signal WSP.

The write switch unit 430 is used only in the write mode, and turned off in the read mode. In the read mode, amplified data of the sense amplifier array unit 440 are outputted into the common data bus unit 500.

Figure 6:
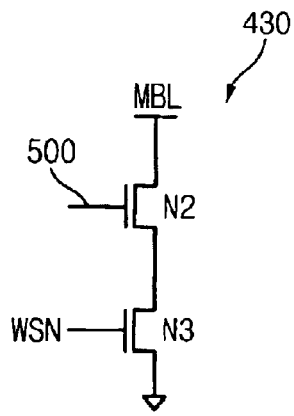
FIG. 6 shows another example of a write switch unit of FIG. 3.

FIG. 6 shows another example of a write switch unit 430 of FIG. 3.

In this example, the write switch unit 430 comprises NMOS transistors N2 and N3 connected serially between the main bitline MBL and a ground voltage terminal. A gate of the NMOS transistor N2 is connected to the common data bus unit 500, and a gate of the NMOS transistor N3 receives a write switch control signal WSN. The common data bus unit 500 has an opposite phase to the main bitline MBL. The phase of the common data bus unit 500 is controlled by a write bus switch unit of FIG. 12.

The NMOS transistor comprised in the write switch unit 430 improves the operation speed due to its rapid switching operation and reduces layout.

Figure 7:
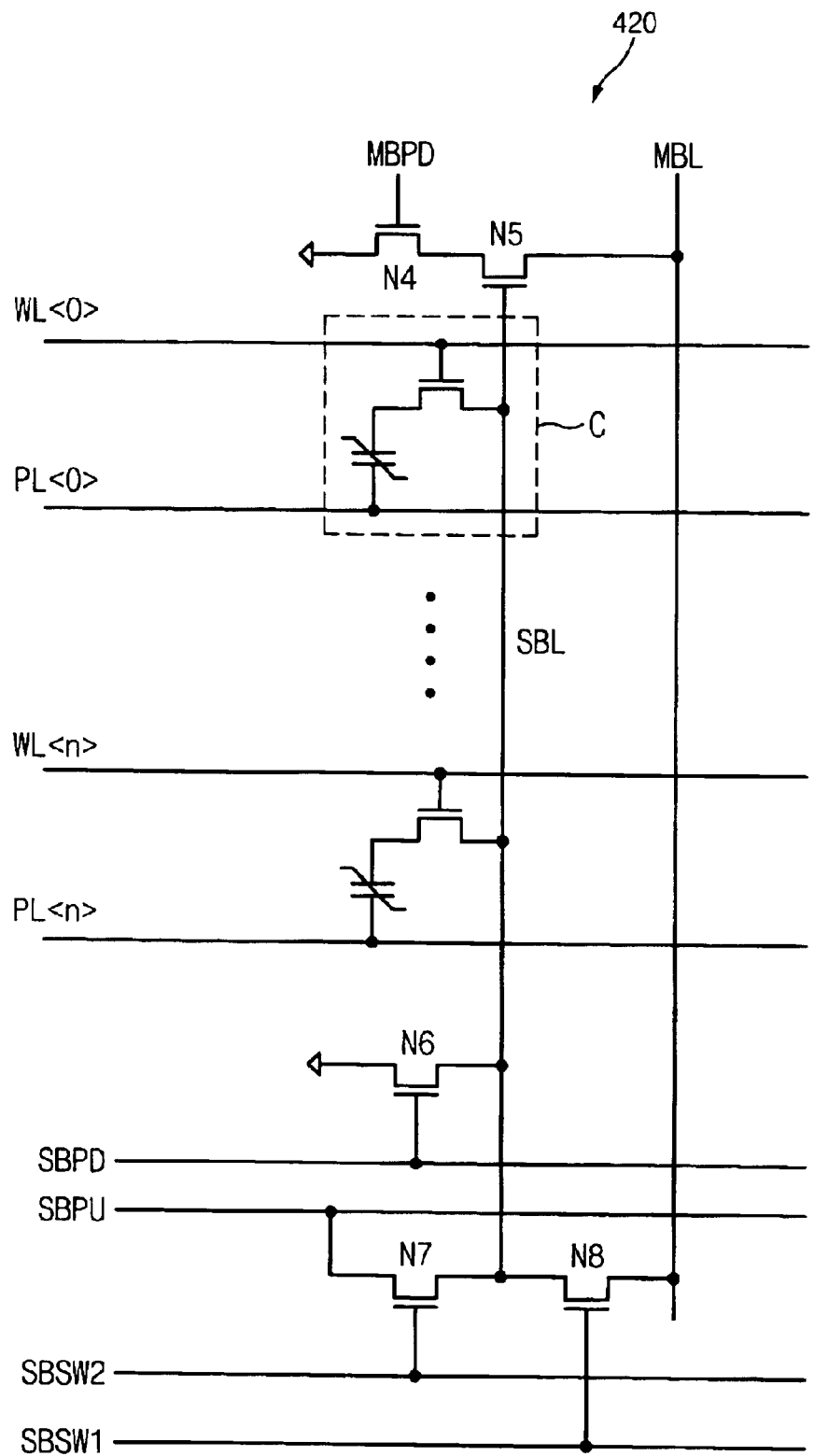
FIG. 7 is a circuit diagram of a sub cell array of FIG. 3.

FIG. 7 is a circuit diagram of the sub cell array 420 of FIG. 3.

Each main bitline MBL of the sub cell array 420 is selectively connected to one of a plurality of sub bitlines SBL. That is, when a sub bitline selecting signal SBSW1 is activated, an NMOS transistor N8 is turned on, thereby activating one sub bitline SBL. One sub bitline SBL is connected to a plurality of cells C.

When a sub bitline pull-down signal SBPD is activated to turn on an NMOS transistor N6, the sub bitline SBL is pulled down to a ground level. A sub bitline pull-up signal SBPU is to control power supplied to the sub bitline SBL. That is, in a low voltage, the sub cell array 420 generates a voltage higher than a power voltage VCC and supplies the voltage to the sub bitline SBL.

An NMOS transistor N7 controls connection between a sub bitline pull-up signal SBPU terminal and the sub bitline SBL in response to a sub bitline selecting signal SBSW2.

An NMOS transistor N5, connected between an NMOS transistor N4 and the main bitline MBL, has a gate connected to the sub bitline SBL. The NMOS transistor N4, connected between the ground voltage terminal and the NMOs transistor N5, has a gate to receive a main bitline pull-down signal MBPD, thereby regulating a sensing voltage of the main bitline MBL.

Figure 8:
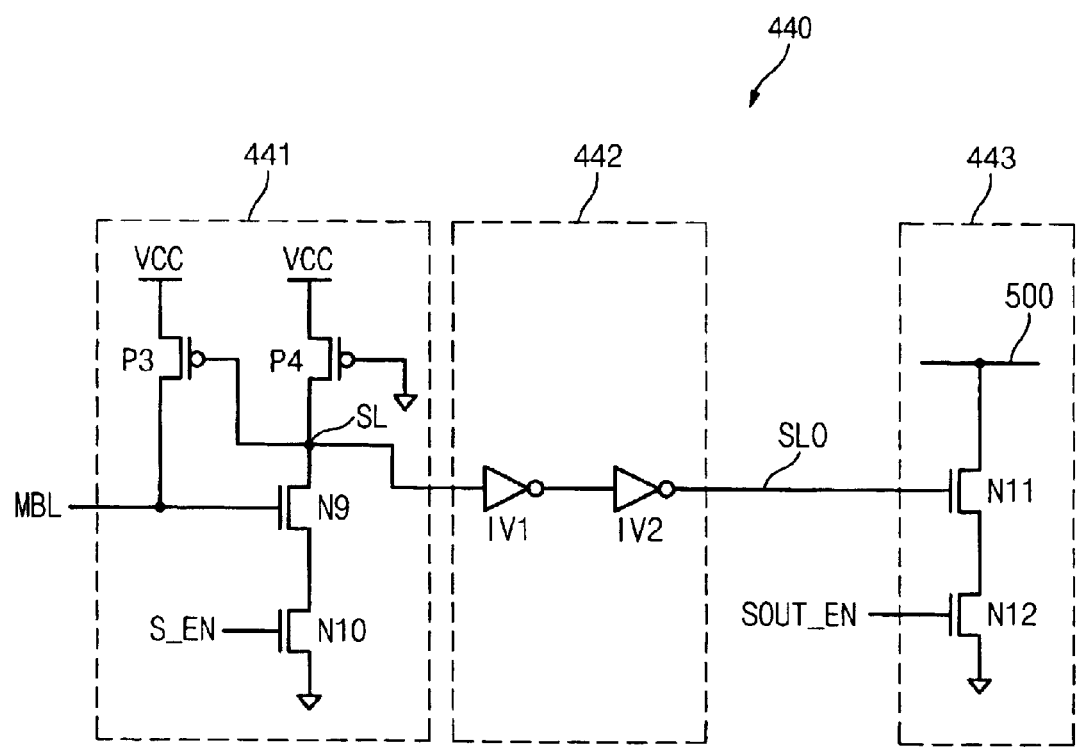
FIG. 8 is a circuit diagram of a sense amplifier array unit of FIG. 3.

FIG. 8 is a circuit diagram of the sense amplifier array unit 440 of FIG. 3.

The sense amplifier array unit 440 comprises a level sensing unit 441, a sensing buffer unit 442 and a sensing output unit 443.

The level sensing unit 441 comprises PMOS transistors P3, P4 and NMOS transistors N9, N10. The PMOS transistor P3, connected between the power voltage VCC terminal and the main bitline MBL, has a gate connected to a node SL. The PMOS transistor P4, connected between the power voltage VCC terminal and the node SL, has a gate to receive a ground voltage.

The NMOS transistor N9, connected between the node SL and the NMOS transistor N8, has a gate to connected to the main bitline MBL. The NMOS transistor N10, connected between the NMOS transistor N9 and the ground voltage terminal, has a gate to receive a sensing enable signal S_EN.

The sensing buffer unit 442 comprises inverters IV1 and IV2 for buffering an output signal from the level sensing unit 441. The inverters IV1 and IV2 detect and buffer an output voltage of the node SL based on a value of a CMOS logic Vt (threshold voltage).

The sensing output unit 443 comprises NMOS transistors N11 and N12. The NMOS transistor N11, connected between the common data bus unit 500 and the NMOS transistor N12, has a gate connected to a node SLO. The NMOS transistor N12, connected between the NMOS transistor N11 and the ground voltage terminal, has a gate to receive a sensing output enable signal SOUT_EN.

Hereinafter, the operation of the sense amplifier array unit 440 is described.

In a normal mode, the NMOS transistor N10 of the level sensing unit 441 is kept turned off. In the read mode, if the sensing enable signal S_EN is enabled to a high level, the NMOS transistor N10 is turned on to apply a ground voltage to the node SL. The gate of the NMOS transistor N9 is connected to the main bitline MBL, and the amount of current flowing in the NMOS transistor N9 is controlled by a voltage of the main bitline MBL.

The amount of current flowing in the PMOS transistor P3 is determined by a voltage of the node SL. As a result, when the node SL is at the ground level, the PMOS transistor P3 is turned on to supply the power voltage VCC to the main bitline MBL. The PMOS transistor P4 which is always turned on supplies constant current to serve as load.

When the main bitline MBL is at the power voltage VCC level, the voltage of the node SL shows a low state. However, when the main bitline MBL is at the ground level, the voltage of the node SL shows a high state.

When the main bitline MBL is at a high level, the voltage of the node SL becomes at the low state, and the PMOS transistor P3 can supply the large amount of current. However, when the voltage of the main bitline MBL gradually falls, the voltage of the node SL gradually rises, and the PMOS transistor P3 can supply the small amount of current. AS the voltage of the main bitline MBL becomes smaller, the voltage drop speed of the main bitline MBL becomes faster.

The voltage drop speed of the main bitline MBL is faster when data transmitted to the main bitline MBL of the memory cell is "high" than when data is "low". As a result, the voltage rise speed of the node SL is larger when the cell data is "high" than when the cell data is "low".

The inverters IV1 and IV2 buffer an output voltage of the node SL on a basis of a logic threshold voltage Vt. On a basis of a time axis, a voltage level difference between the cell data "high" and "low" can be largely amplified with a critical value of the logic threshold voltage Vt in the reference timing strobe interval. Here, the sensing voltage level margin can be regulated by regulating the logic threshold voltage Vt of the inverters IV1 and IV2.

The NMOS transistor N12 is kept turned off in the normal mode. IN the read mode, a sensing output enable signal SOUT_EN is enabled to turn on the NMOS transistor N12. As a result, a voltage level of the common data bus unit 500 is determined depending on a voltage level state of the node SLO.

The common data bus unit 500 is maintained at a precharge state to a high level by a bus pull-up unit, and pulled down by the voltage level of the node SLO. When the node SLO is at a high level, the common data bus unit 500 is pulled down to a low level. However, when the node SLO is at a low level, the common data bus unit 500 is maintained at a high level.

Figure 9:
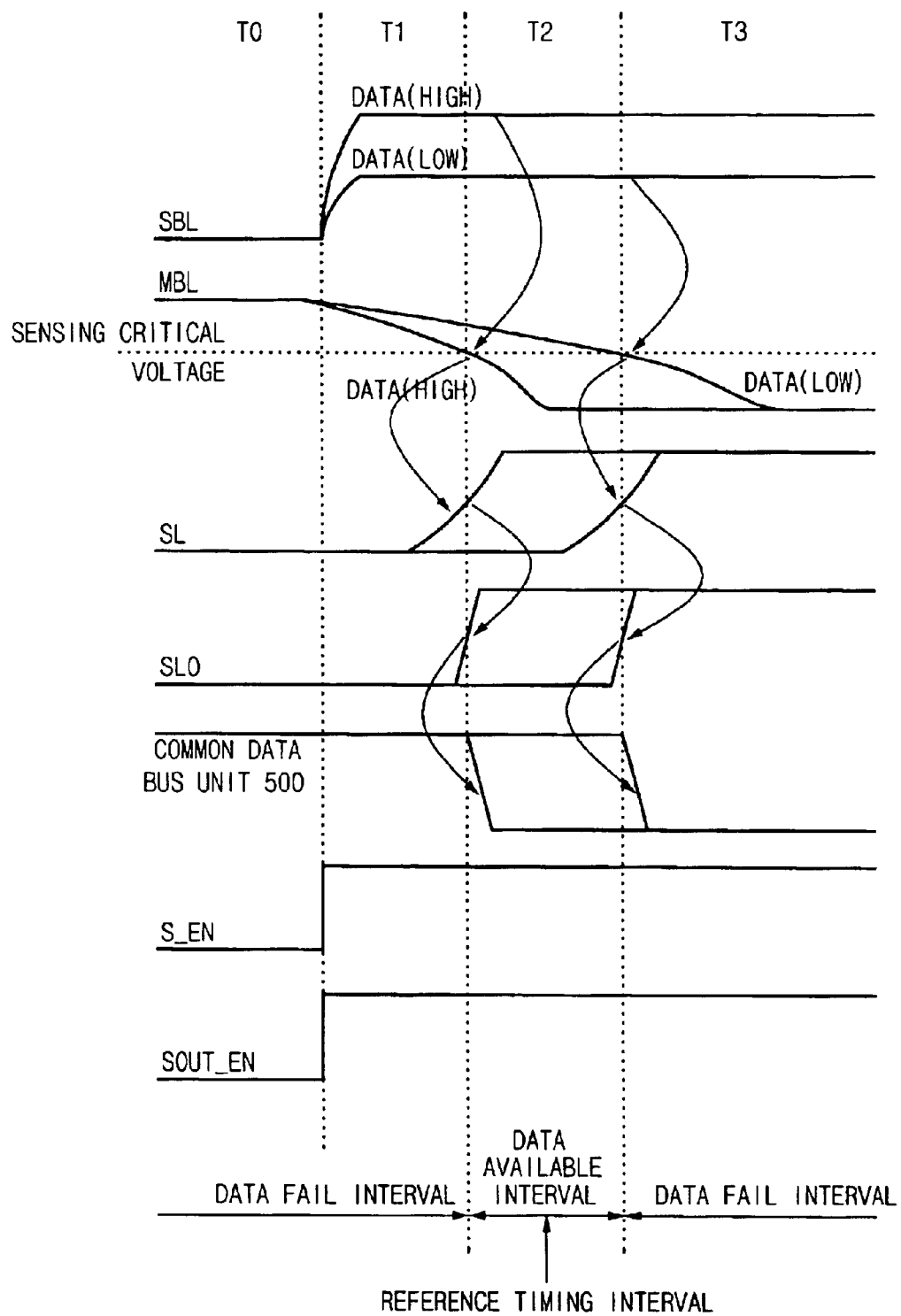
FIG. 9 is a timing diagram of a sense amplifier array unit of FIG. 8.

FIG. 9 is a timing diagram illustrating the operation of the sense amplifier array unit 440 of FIG. 8.

In an interval T0, a wordline WL and a plateline PL are inactive, and the main bitline MBL and the common data bus unit 500 are precharged to a high level. Here, the sub bitline SBL and the node SL are precharged to a low level. The sensing enable signal S_EN and the sensing output enable signal SOUT_EN are disabled.

In an interval T1, the wordline WL and the plateline PL are activated to a high level. At the same time, data "high" or "low" are applied to the sub bitline SBL and the main bitline MBL.

The sensing enable signal S_EN and the sensing output enable signal SOUT_EN as sense amplifier control signals are activated to a high level. As a result, the sense amplifier array unit 440 performs amplification and sensing operations of data. The voltage level of the main bitline MBL is reduced until it reaches a sensing critical voltage level.

In an interval T2, the voltage level of the cell data "high" reaches the sensing critical voltage earlier than that of data "low". That is, the voltage of the node SL reaches the logic threshold voltage Vt level of the inverter IV1 earlier when cell data is "high" than when cell data is "low". The voltage level of the node SLO transits to a high level to output a low level into the common data bus unit 500. Here, when the voltage level of the node SL rises, the voltage level of the PMOS transistor P3 falls rapidly from when driving current of the PMOS transistor P3 is reduced.

In the interval T2, the voltage level of the cell data "low" does not reach the level of the sensing critical voltage.

Thus, there is a time difference for the interval T2 based on the time axis when the cell data "high" and "low" individually reach the sensing critical voltage level. During the interval T2, the reference timing strobe interval, the write data register array unit 300 can decide efficiency of the cell data by determining cell data "high" or "low". Here, a read lock control signal R_LOCK of the read/write data register array unit 300 determines when a reference timing strobe is applied.

When the common data bus unit 500 is at a low level in the interval T2, the cell data shows "high". On the other hand, when the common data bus unit 500 is at a high level in the interval T2, the cell data shows "low".

Thereafter, in an interval T3, when cell data is "low", the voltage level of the node SL reaches the voltage level of the logic threshold voltage Vt. In the interval T3, the voltage levels of the nodes SL and SLO are enabled to a high level regardless of cell data "high" or "low". As a result, the common data bus unit 500 is disabled to a low level.

Figure 10:
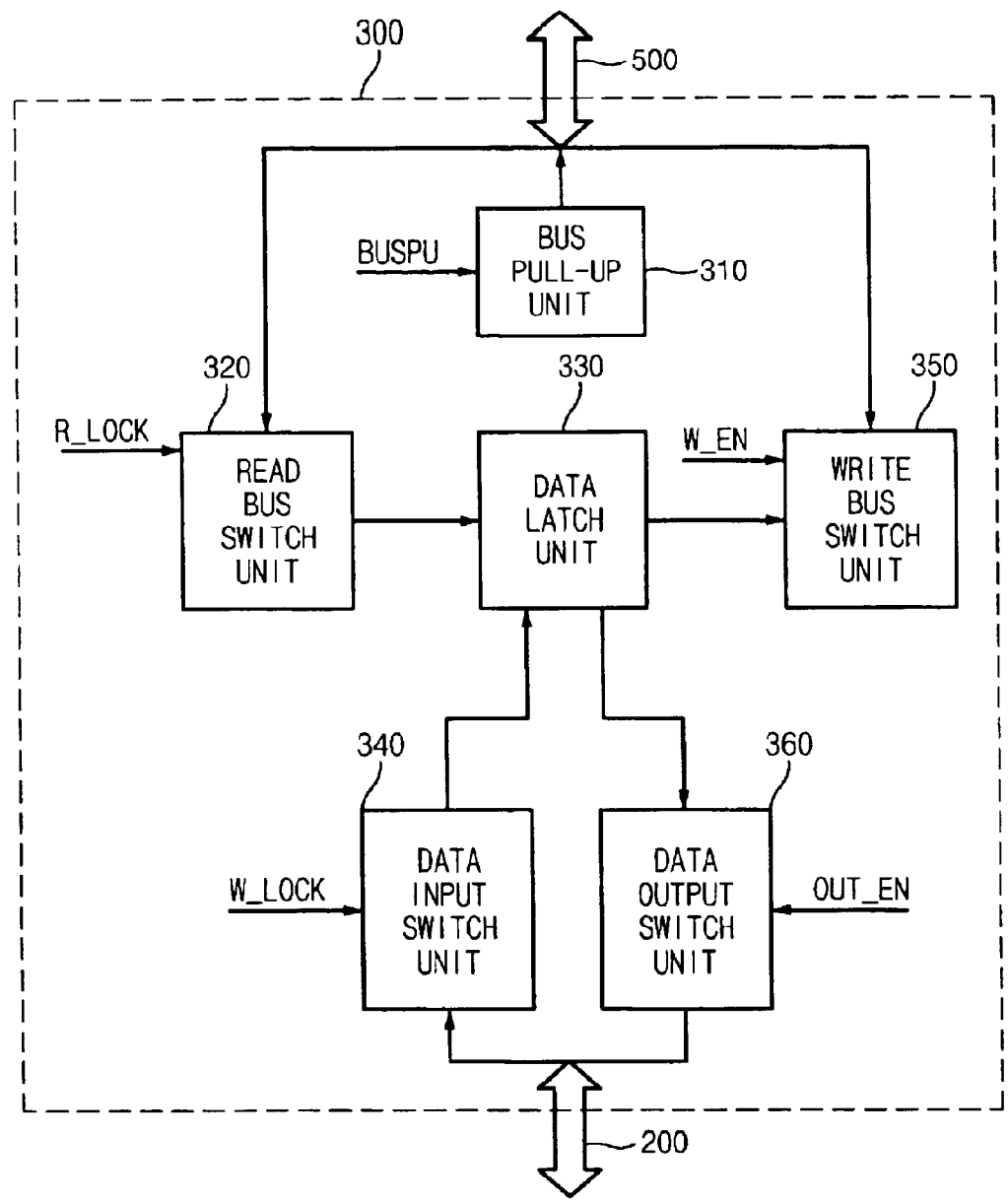
FIG. 10 is a diagram of a read/write data register array unit in the nonvolatile ferroelectric memory device according to a first embodiment of the present invention.

FIG. 10 is a diagram of the read/write data register array unit 300 in the nonvolatile ferroelectric memory device of FIGS. 1 and 2.

The read/write data register array unit 300 comprises a bus pull-up unit 310, a read bus switch unit 320, a data latch unit 330, a data input switch unit 340, a write bus switch unit 350 and a data output switch unit 360.

The bus pull-up unit 310 pulls up the common data bus unit 500 from an initial state in response to a bus pull-up control signal BUSPU. The read bus switch unit 320 outputs data applied from the common data bus unit 500 into the data latch unit 330 in response to the read lock control signal R_LOCK.

The data latch unit 330 stores read data applied from the read bus switch unit 320 and input data applied from the data input switch unit 340. The data input switch unit 340 outputs input data applied from the data buffer bus unit 200 into the data latch unit 330 in response to a write lock control signal W_LOCK.

The write bus switch unit 350 outputs data stored in the data latch unit 330 into the common data bus unit 600 in response to a write enable signal W_EN. The data output switch unit 360 outputs data stored in the data latch unit 330 into the data buffer bus unit 200 in response to an output enable signal OUT_EN.

Figure 11:
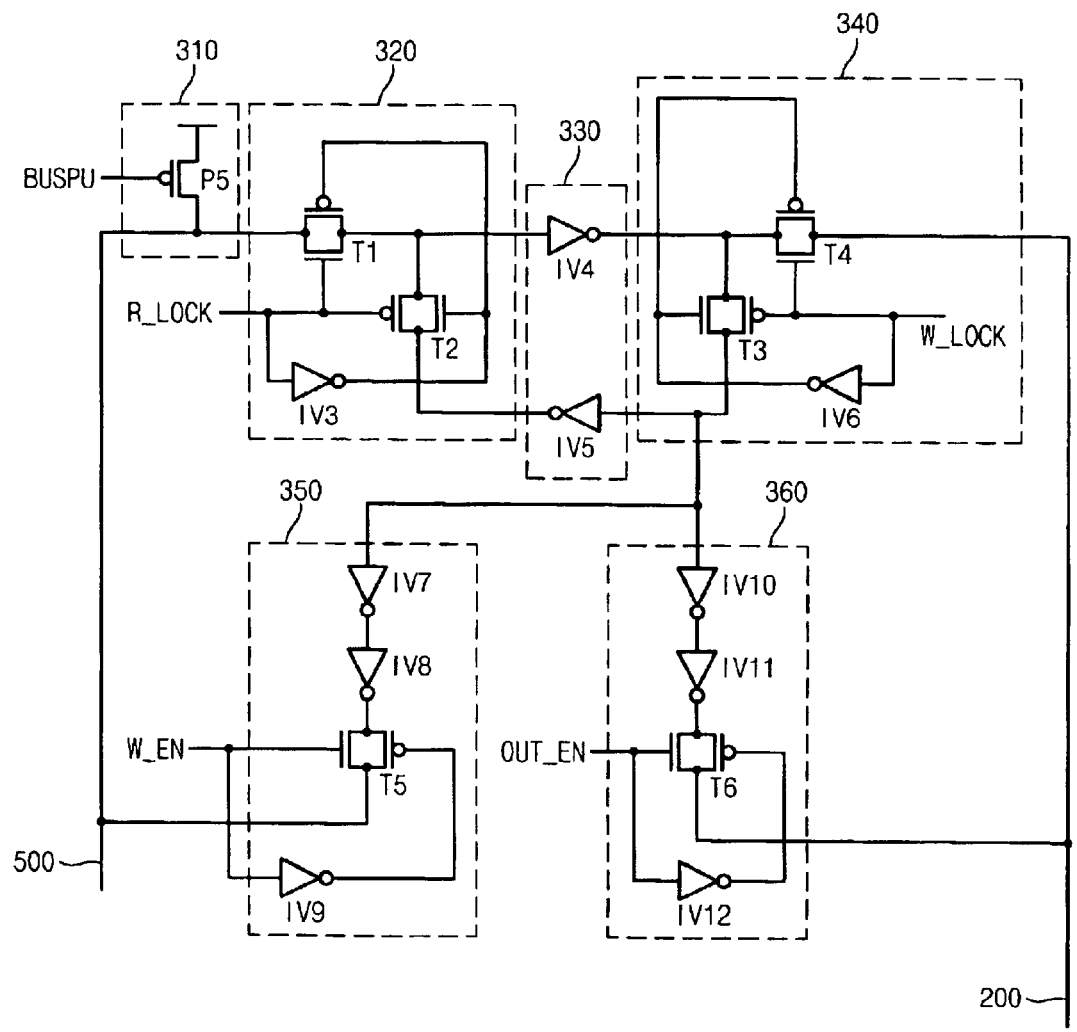
FIG. 11 is a circuit diagram of the read/write data register array unit of FIG. 10.

FIG. 11 is a circuit diagram of the read/write data register array unit 300 of FIG. 10.

The bus pull-up unit 310 comprises a PMOS transistor P5. The PMOS transistor P5, connected between the power voltage terminal and the common data bus unit 500, has a gate to receive the bus pull-up control signal BUSPU.

The read bus switch unit 320 comprises transmission gates T1 and T2, and an inverter IV3. The inverter IV3 inverts the read lock control signal R_LOCK. The transmission gate T1 selectively outputs read data applied from the common data bus unit 500 in response to the read lock control signal R_LOCK. The transmission gate T2 selectively outputs an output signal from an inverter IV5 in response to the read lock control signal R_LOCK.

The data latch unit 330 comprises inverters IV4 and IV5 connected with a latch type.

The data input switch unit 340 comprises an inverter IV6, and transmission gates T3 and T4. The inverter IV6 inverts the write lock control signal W_LOCK. The transmission gate T3 selectively outputs an output signal from the inverter IV4 in response to the write lock control signal W_LOCK. The transmission gate T4 selectively outputs an output signal from the data buffer bus unit 200 in response to the write lock control signal W_LOCK.

The write bus switch unit 350 comprises inverters IV7~IV9, and a transmission gate T5. The inverters IV7 and IV8 delay an output signal from the transmission gate T3. The inverter IV9 inverts the write enable signal W_EN. The transmission gate T5 selectively outputs an output signal from the inverter IV8 into the common data bus unit 500 in response to the write enable signal W_EN.

The data output switch unit 360 comprises inverters IV10~IV12, and a transmission gate T6. The inverters IV10 and IV11 delay the output signal from the transmission gate T3. The inverter IV12 inverts the output enable signal OUT_EN. The transmission gate T6 selectively outputs an output signal from the inverter IV11 into the data buffer bus unit 200 in response to the output enable signal OUT_EN.

Figure 12:
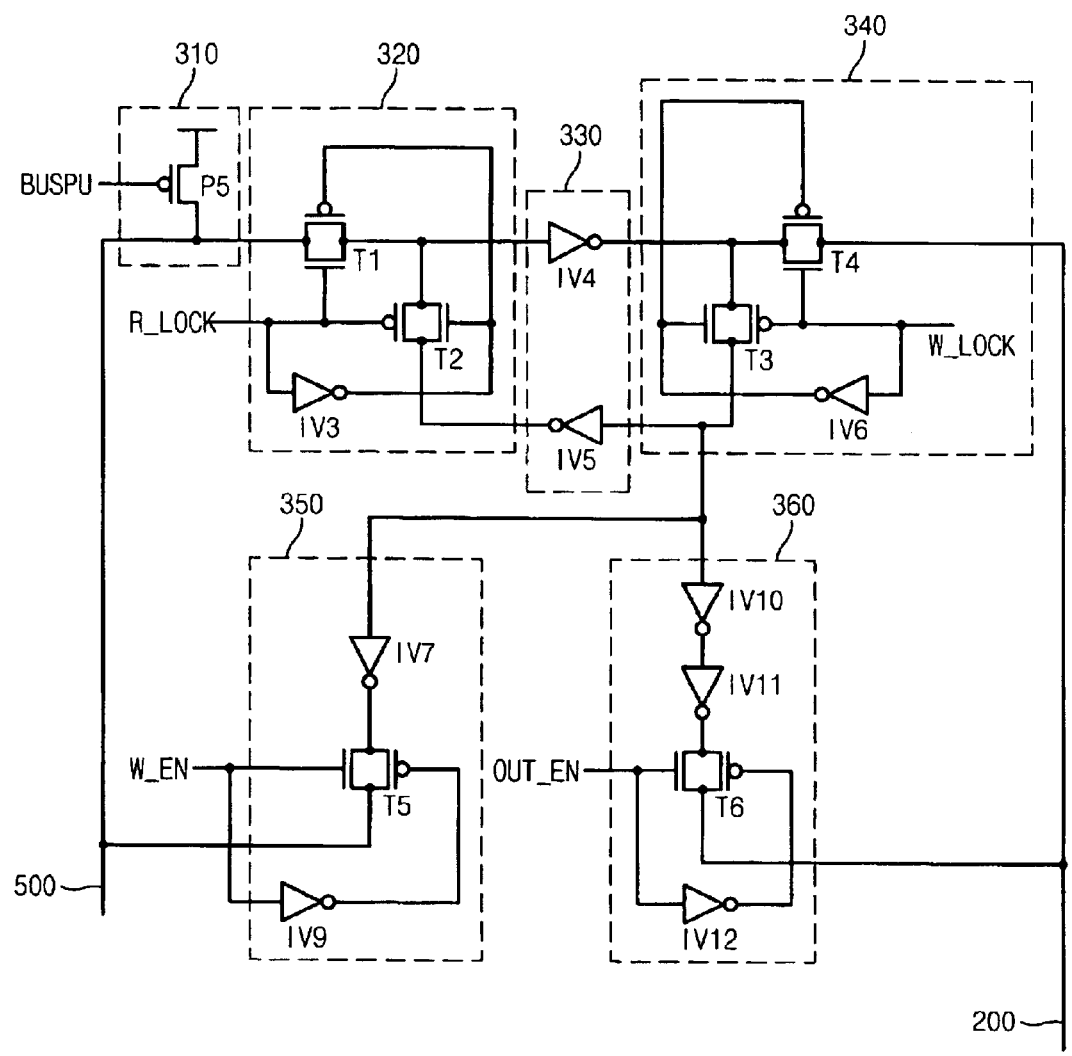
FIG. 12 shows another example of the read/write data register array unit of FIG. 10.

FIG. 12 shows another example of the read/write data register array unit 300 of FIG. 11.

The embodiment of FIG. 12 is different from that of FIG. 11 in that the write bus switch unit 350 comprises an inverter IV7. The write bus switch unit 350 inverts an output signal from the data input switch unit 340, and outputs the inverted signal into the common data bus unit 500. The rest configuration and operation are the same as those of FIG. 11.

Figure 13:
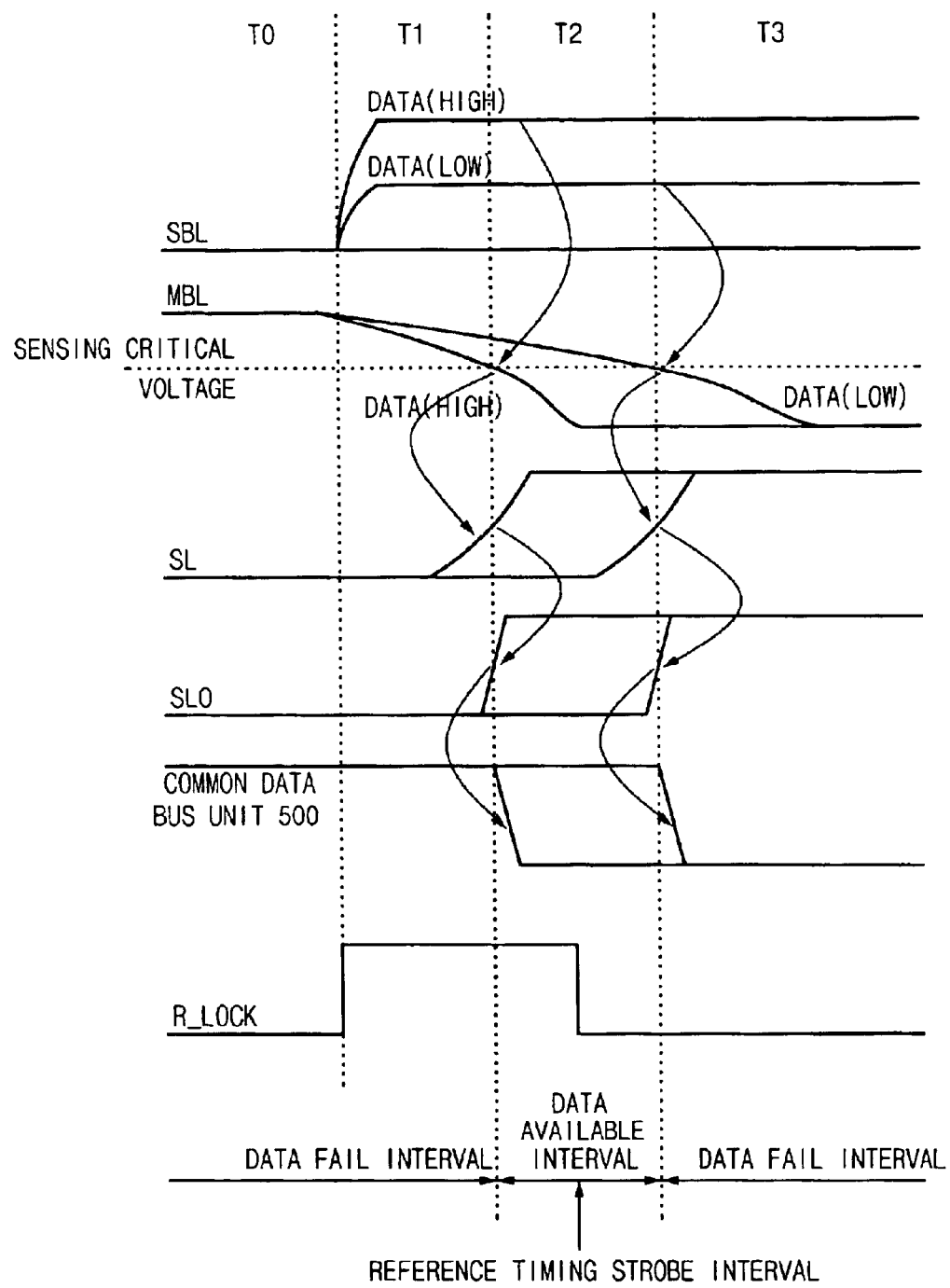
FIG. 13 is a timing diagram illustrating the operation of the read/write data register array unit of FIG. 10.

FIG. 13 is a timing diagram illustrating the operation of the read/write data register array unit 300 of FIG. 10.

In an interval T1, if the read lock control signal R_LOCK is enabled, cell sensing data applied from the common data bus unit 500 are stored in the data latch unit 330. That is, while the read lock control signal R_LOCK is at a high level, read data are continuously stored in the data latch unit 330. Here, the write lock control signal W_LOCK becomes at a low level to turn on the transmission gate T3. As a result, the read data can be stored in the data latch unit 330.

In an interval T2, if the read lock control signal R_LOCK transits to a low level, the read data are no longer inputted into the data latch unit 330. AS a result, when the read lock control signal R_LOCK is disabled and the reference timing strobe is applied, the data previously stored in the data latch unit 330 can be continuously maintained.

In an interval T3, since the data "high" and "low" become all at a low level, the read data are no longer stored in the data latch unit 330. During a data available interval of the T2, data inputted when the reference timing strobe is applied are finally stored in the data latch unit 330.

Figure 14:
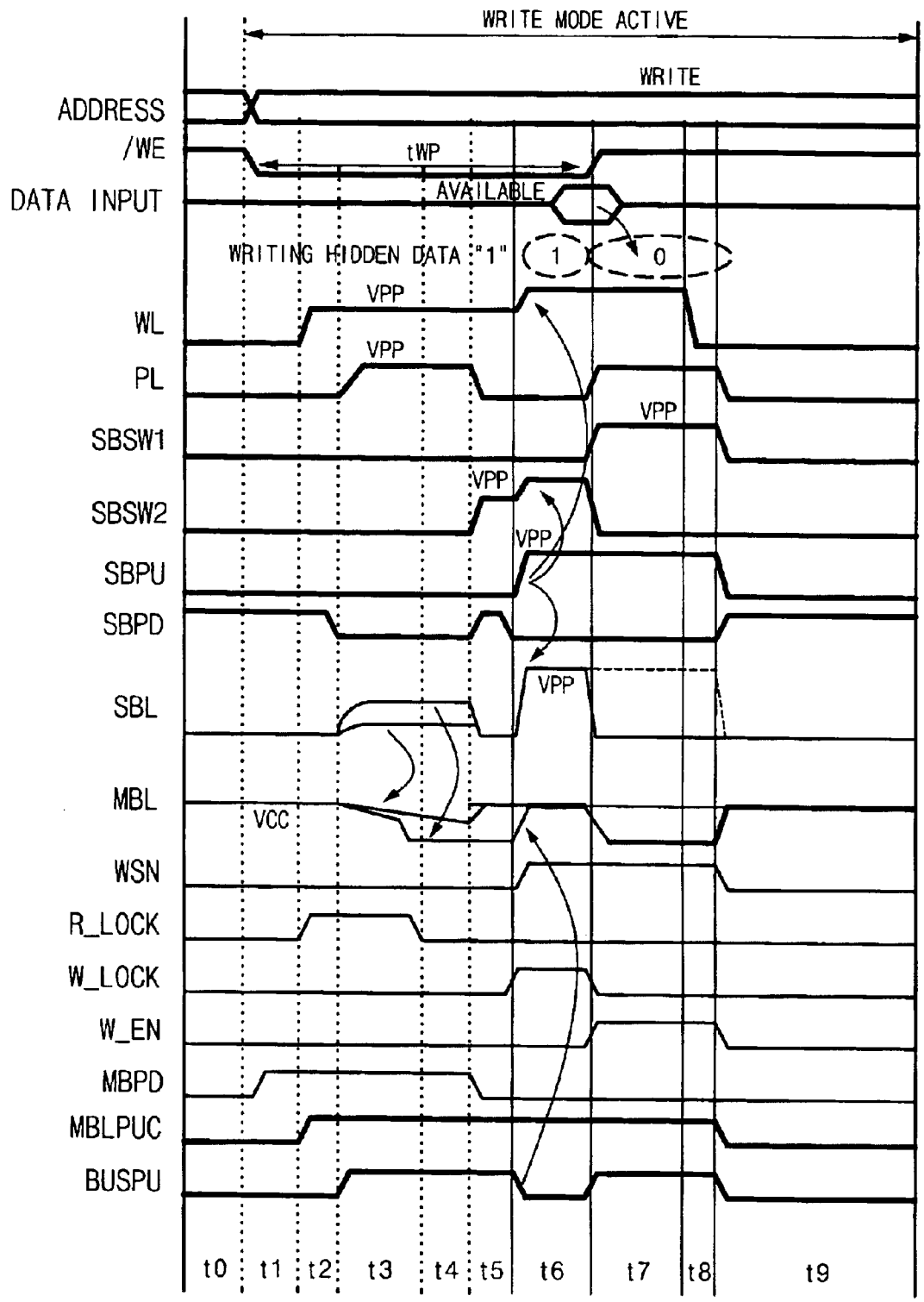
FIGS. 14 and 15 are timing diagrams illustrating a method for controlling a nonvolatile ferroelectric memory having a timing reference control function according to a first embodiment of the present invention.

FIG. 14 is a timing diagram illustrating the write operation in a method for controlling a nonvolatile ferroelectric memory having a timing reference control function according to a first embodiment of the present invention.

In an interval t1, if an address transits and a write enable signal /WE is disabled to a low level, the write mode becomes active. The main bitline pull-down signal MBPD is enabled to a high level. Since the main bitline pull-up control signal MBLPUC and the bus pull-up control signal BUSPU are maintained at a low level, the main bitline MBL is precharged to the high level.

Before the wordline WL and the plateline PL are activated, the main bitiline MBL and the common data bus unit 500 are pulled up to a high level in the intervals t0 and t1.

Thereafter, when an interval t2 starts, the wordline WL is enabled, and the sub bitline pull-down signal SBPD is disabled to a low level. As a result, a storage node of the cell is initialized to the ground level. The read lock control signal R_LOCK and the main bitline pull-up control signal MBLPUC are enabled to a high level. In the interval t2, the wordline WL is activated earlier than the plateline PL. Thus, the storage node of the cell is stabilized in the initial operation, thereby improving the sensing margin.

When an interval t3, a data sensing interval, starts, the plateline PL is enabled to a pumping voltage VPP level, and the cell data are applied to the main bitline MBL. The bus pull-up control signal BUSPU is enabled to a high level, thereby stopping the pull-up operation of the common data bus unit 500.

When an interval t4 starts, if the read lock control signal R_LOCK is disabled and the reference timing strobe is applied, amplified data of the sense amplifier array unit 440 are stored in the data latch unit 330.

When an interval t5 starts, the plateline PL is disabled to a low level, and the sub bitline selecting signal SBSW2 is enabled to the pumping voltage VPP level. Then, the sub bitline pull-down signal SBPD is enabled to a high level, and the sub bitline SBL becomes at the low level. The main bitlint pull-down signal MBPD is disabled to a low level, and the main bitline MBL is enabled to a high level.

When an interval t6 starts, the voltage level of the wordline WL rises to write cell data "high". Then, if the sub bitline pull-up signal SBPU is enabled and the voltage level of the sub bitline selecting signal SBSW2 rises, the sub biltine SBL rises to the pumping voltage VPP level. The sub bitline pull-down signal SBPD is disabled to a low level.

In the interval t6 before data "0" is written, the main btiline MBL is pulled up to a high level. In the interval t6, the main tbielin MBL is enabled to the high level when the bus pull-up control signal BUSPU is disabled.

Here, if the write lock control signal W_LOCK is enabled to a high level, the input data inputted from the data buffer bus unit 200 are stored in the data latch unit 330. The write bus switch unit 350 outputs data stored in the data latch unit 330 into the common data bus unit 500 when the write enable signal W_EN is enabled. If the write switch control signal WSN is enabled to a high level, data of the common data bus unit 500 are outputted into the main bitline MBL.

When an interval t7 starts, if the write enable signal /WE and the plateline PL are enabled to a high level, cell data "0" is restored during the data available interval. Then, the write lock control signal W_LOCK is disabled to a low level, and the input data inputted into the data input switch unit 340 are stored in the data latch unit 330.

Here, the main bitline MBL is disabled to a low level, and the write enable signal W_EN and the bus pull-up control signal BUSPU become at a high level. Then, the sub bitline selecting signal SBSW1 rises to the pumping voltage VPP level, and the sub bitline selecting signal SBSW2 is disabled to a low level. As a result, data of the main bitline MBL are outputted into the sub bitline SBL.

When cell data is "high", the sub bitline SBL becomes at a high level. Thus, current of the switching transistor of the cell C becomes larger, and the voltage level of the main bitline induced from the cell data "low" becomes lower. On the other hand, when cell data is "low", the sub bitline SBL becomes at a low level in the read mode. As a result, the current of the switching transistor of the cell C becomes smaller, and the voltage level of the main bitline MBL induced from the cell data "high" becomes higher.

In order to write new data, while the sub bitline selecting signal SBSW1 is enabled, data stored in the read/write data register array unit 300 are applied to the sub bitline SBL and the main bitline MBL, respectively. Here, when writing data is "0", data "low" are stored in the memory cell.

When an interval t8 starts, the wordline WL is disabled earlier than the plateline PL.

Thereafter, when an interval t9 starts, the plateline PL, the sub bitline selecting signal SBSW1 and the sub bitline pull-up signal SBPU are disabled to a low level. Then, the sub bitline pull-down signal SBPD and the main bitline MBL are enabled to the high level. Also, the main bitline pull-up control signal MBLPUC and the bus pull-up control signal BUSPU are disabled to a low level.

Here, the write switch control signal WSN is disabled to a low level to disconnect the common data bus unit 500 to the main bitline MBL. Then, since the write enable signal W_EN is disabled to a low level, data are no longer inputted into the common data bus unit 500.

Figure 15:
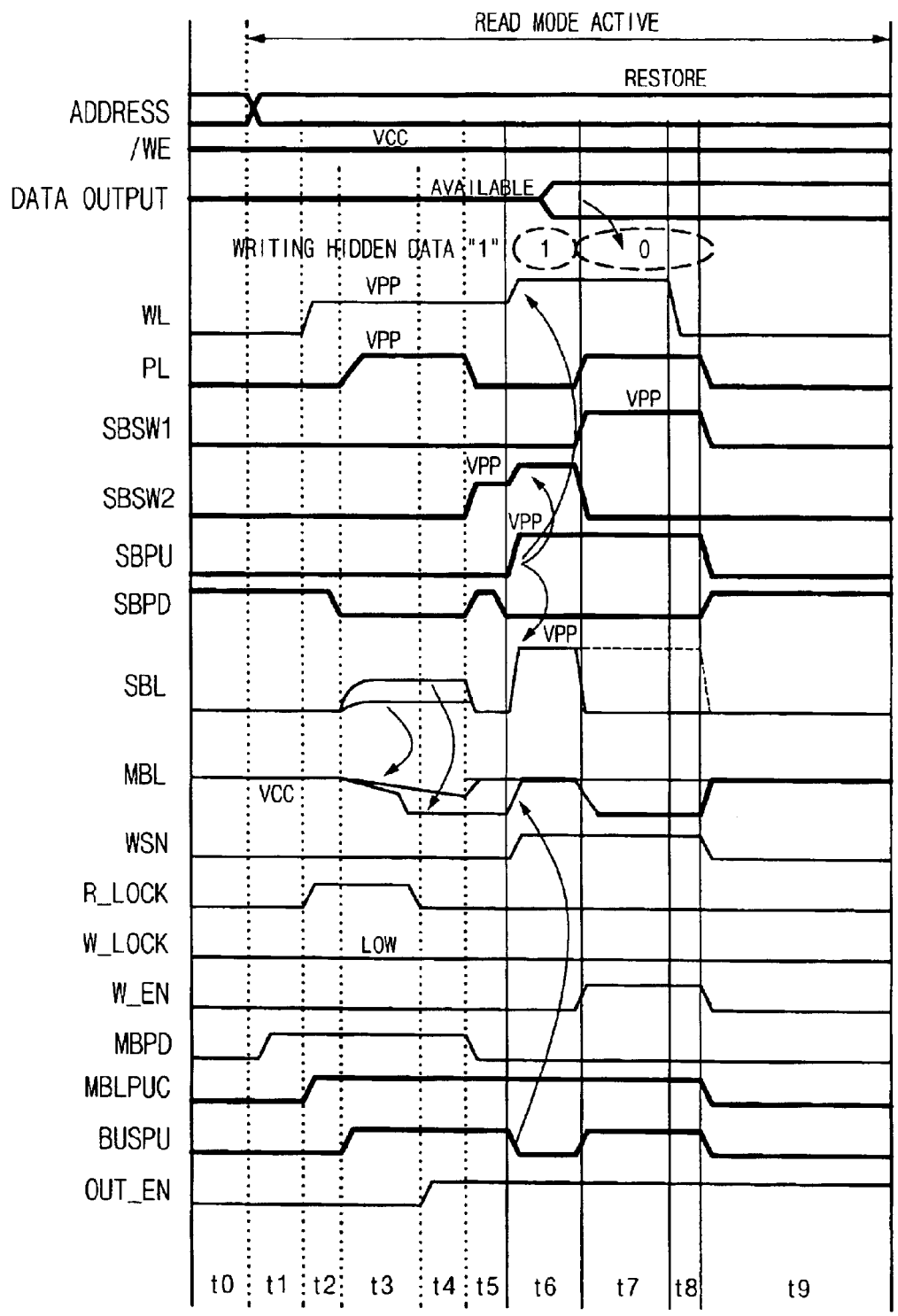

FIG. 15 is a timing diagram illustrating the read operation in a method for controlling a nonvolatile ferroelectric memory having a timing reference control function according to a first embodiment of the present invention.

In the read mode, the write enable signal /WE is maintained at the power voltage level. After the interval t6, the data output available interval is maintained.

Here, the write lock control signal W_LOCK is maintained at a low level. As a result, the input data inputted externally through the data buffer bus unit 200 are not written in the cell, but the read data stored in the data latch unit 330 are restored in the cell.

In the interval t4, the output enable signal OUT_EN is enabled to a high level. As a result, the read data stored in the data latch unit 330 by the read lock control signal R_LOCK are outputted through the data buffer bus unit 200.

Figure 16:
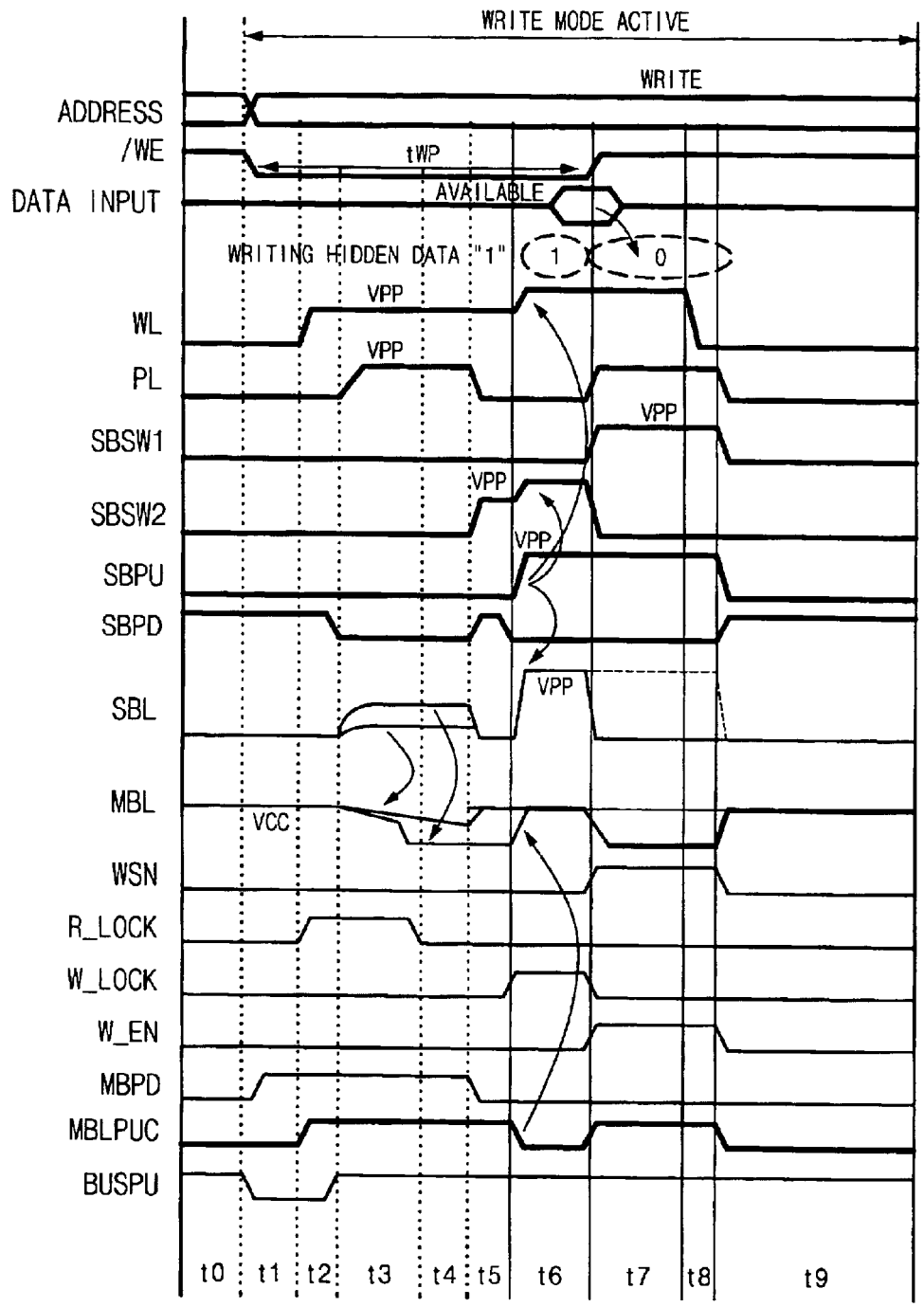
FIGS. 16 and 17 are timing diagrams illustrating a method for controlling a nonvolatile ferroelectric memory having a timing reference control function according to a second embodiment of the present invention.

FIG. 16 is a timing diagram illustrating the write operation in a method for controlling a nonvolatile ferroelectric memory having a timing reference control function according to a second embodiment of the present invention.

When an interval t1 starts, the bus pull-up control signal BUSPU is disabled to a low level to pull up the common data bus unit 500 to the power voltage. When an interval t2 starts, the main bitline pull-up control signal MBLPUC is enabled to a high level to stop the pull-up operation of the main bitline MBL.

When an interval t3 starts, the bus pull-up control signal BUSPU is enabled to the high level again to stop the pull-up operation of the common data bus unit 500. When an interval t6 starts, the main bitline pull-up control signal MBLPUC is disabled to a low level to pull up the main bitline MBL. When an interval t7 starts, the write switch control signal WSN is enabled to a high level, data of the common data bus unit 500 are outputted into the main bitline MBL. The rest operation of FIG. 16 is the same as that of FIG. 14.

Figure 17:
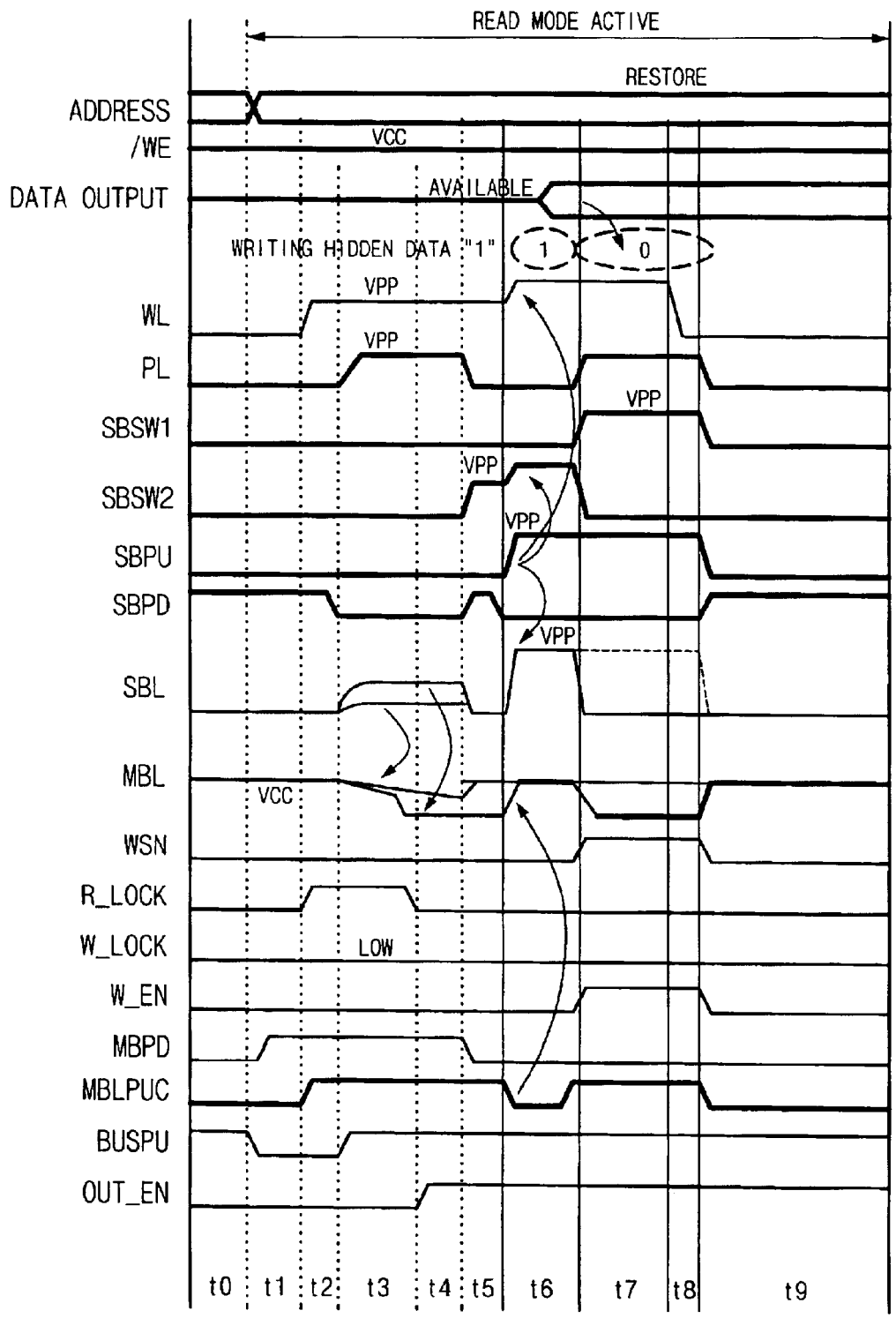

FIG. 17 is a timing diagram illustrating the read operation in a method for controlling a nonvolatile ferroelectric memory having a timing reference control function according to a second embodiment of the present invention.

During the intervals t1 and t2, the bus pull-up control signal BUSPU is disabled to pull up the common data bus unit 500. During the interval t6, the main bitline pull-up control signal MBLPUC is disabled to pull up the main bitiline MBL. During the intervals t6~t8, the write enable signal W_EN is enabled to output data into the common data bus unit 500. During the intervals t7 and t8, the write switch control signal WSN is enabled to connect the common data bus unit 500 to the main bitline MBL. The rest operation of FIG. 17 is the same as that of FIG. 15.

As described above, a nonvolatile ferroelectric memory device according to an embodiment of the present invention performs read/write operations of data through a common data bus, thereby reducing the area of a data bus. In the nonvolatile ferroelectric memory device, data read/written through a register are stored, thereby improving a data access time. In addition, since an extra reference voltage generating circuit is not required due to a self-reference sensing circuit, the margin of the sensing voltage can be secured in a low voltage and the operation speed can be also improved.

What is claimed is:

1. A nonvolatile ferroelectric memory device having a timing reference control function, comprising:
    a plurality of cell array blocks for amplifying a sensing voltage of cell data in a reference timing strobe interval on a basis of a logic threshold voltage, wherein each of the plurality of cell array blocks comprises a nonvolatile ferroelectric memory;
    a read/write data register array unit for storing read data applied from the plurality of cell array blocks when a read lock control signal is activated, and for storing the read data or input data written in the plurality of cell array blocks when a write lock control signal is activated; and
    a common data bus unit, connected in common to the plurality of cell array blocks, for exchanging the read data or the input data between the plurality of cell array blocks and the read/write data register array unit.

2. The device according to claim 1, wherein the plurality of cell array blocks comprise:
    a plurality of upper cell array blocks connected in common to the common data bus unit and arranged above the common data bus unit; and
    a plurality of lower cell array blocks connected in common to the common data bus unit and arranged under the common data bus unit.

3. The device according to claim 1, wherein each of the plurality of cell array blocks comprises:
    a main bitline pull-up controller for pulling up a main bitline in response to a main bitline pull-up control signal;
    a plurality of sub cell arrays comprising the nonvolatile ferroelectric memory;
    a write switch unit for selectively connecting the common data bus unit to the main bitline in response to a write switch control signal; and
    a sense amplifier array unit for amplifying a voltage level of the cell data using a threshold value of the logic threshold voltage on a predetermined time axis.

4. The device according to claim 3, wherein the write switch unit comprises a first NMOS transistor and a second NMOS transistor which are connected between the main bitline and a ground voltage terminal and selectively switched in response to an output signal from the common data bus unit and the write switch control signal.

5. The device according to claim 3, wherein the sense amplifier array unit comprises:
    a level sensing unit for comparing the threshold value with a sensing voltage of the main bitline when a sensing enable signal is enabled, and for amplifying a sensing voltage level of cell data of the main bitline;
    a sensing buffer unit for buffering an output voltage of the level sensing unit; and
    a sensing output unit for determining a voltage level of the common data bus unit depending on an output voltage of the sensing buffer unit when a sensing output enable signal is enabled.

6. The device according to claim 5, wherein the level sensing unit comprises:
    a first driver for outputting a ground voltage into a first node when the sensing enable signal is enabled;
    a second driver for controlling the amount of current applied to the first node by a voltage of the main bitline;
    a third driver for controlling the amount of current supplied to the main bitline depending on a voltage level of the first node; and
    a fourth driver for supplying a predetermined current to the first node.

7. The device according to claim 5, wherein the sensing buffer unit comprises a plurality of inverter chains for buffering an output voltage of the level sensing unit on a basis of the logic threshold voltage.

8. The device according to claim 5, wherein the sensing output unit comprises:
    a fifth driver for outputting a ground voltage when the sensing output enable signal is enabled; and
    a sixth driver for determining a voltage level of the common data bus unit depending on an output voltage of the sensing buffer unit.

9. The device according to claim 1, wherein the read/write data register array unit comprises:
    a bus pull-up unit for pulling up the common data bus unit from an initial state in response to a bus pull-up control signal;
    a read bus switch unit for selectively outputting the read data applied from the common data bus unit in response to the read lock control signal;
    a data input switch unit for selectively outputting the input data applied from a data buffer bus unit in response to the write lock control signal;
    a data latch unit for storing the read data and the input data;
    a write bus switch unit for outputting the input data or read data stored in the data latch unit into the common data bus unit in response to a write enable signal; and
    a data output switch unit for outputting read data stored in the data latch unit into the data buffer bus unit in response to an output enable signal.

10. The device according to claim 9, wherein the read bus switch unit comprises:
    a first transmission gate for selectively outputting the read data in response to the read lock control signal; and
    a second transmission gate for selectively outputting the read data into the data latch unit in response to the read lock control signal.

11. The device according to claim 9, wherein the data input switch unit comprises:
- a third transmission gate for selectively outputting the input data in response to the write lock control signal; and
- a fourth transmission gate for selectively outputting the input data into the data latch unit in response to the write lock control signal.

12. The device according to claim 9, wherein the write bus switch unit comprises:
- a delay unit for delaying an output signal from the data latch unit for a predetermined time; and
- a fifth transmission gate for selectively outputting an output signal from the delay unit into the common data bus unit in response to the writ enable signal.

13. A nonvolatile ferroelectric memory device having a timing reference control function, comprising:
- a plurality of cell array blocks;
- a common data bus unit connected in common to the plurality of cell array blocks; and
- a read/write data register array unit for storing read data applied from the plurality of cell array blocks through the common data bus unit, and for storing input data to be written in a plurality of cell array blocks through the common data bus unit, wherein each cell array block comprises a sense amplifier array unit for converting a self-sensing voltage of cell data on a predetermined time axis, and amplifying a voltage level of the cell data using a threshold value of a logic threshold voltage for a reference timing strobe interval.

14. The device according to claim 13, wherein the sense amplifier array unit comprises:
- a level sensing unit for amplifying a sensing voltage level of the cell data high when a sensing enable signal is enabled and a sensing voltage of a main bitline is below the threshold value;
- a sensing buffer unit for buffering an output voltage of the level sensing unit on a basis of the logic threshold voltage; and
- a sensing output unit for determining a voltage level of the common data bus unit depending on an output voltage of the sensing buffer unit when a sensing output enable signal is enabled.

15. The device according to claim 13, wherein the read/write data register array unit comprises:
- a bus pull-up unit for pulling up the common data bus unit from an initial state in response to a bus pull-up control signal;
- a read bus switch unit for selectively outputting the read data applied from the common data bus unit in response to a read lock control signal;
- a data input switch unit for selectively outputting the input data applied from a data buffer bus unit in response to a write lock control signal;
- a data latch unit for storing the read data and the input data;
- a write bus switch unit for outputting the input data or read data stored in the data latch unit into the common data bus unit in response to a write enable signal; and
- a data output switch unit for outputting read data stored in the data latch unit into the data buffer bus unit in response to an output enable signal.

16. A nonvolatile ferroelectric memory device having a timing reference control function, comprising:
- a plurality of cell array blocks;
- a common data bus unit connected in common to the plurality of cell array blocks; and
- a read/write data register array unit for storing read data applied from the plurality of cell array blocks through the common data bus unit, and storing input data to be written in a plurality of cell array blocks through the common data bus unit, wherein the read/write data register array unit comprises:
- a bus pull-up unit for pulling up the common data bus unit from an initial state in response to a bus pull-up control signal;
- a read bus switch unit for selectively outputting the read data in response to a read lock control signal;
- a data input switch unit for selectively outputting the input data applied from a data buffer bus unit in response to a write lock control signal;
- a data latch unit for storing the read data and the input data;
- a write bus switch unit for outputting the input data or read data stored in the data latch unit in response to a write enable signal; and
- a data output switch unit for outputting read data stored in the data latch unit into the data buffer bus unit in response to an output enable signal.

17. The device according to claim 16, wherein each of the plurality of cell array blocks comprises a sense amplifier array unit for converting a self-sensing voltage of cell data for a reference timing strobe interval, and for amplifying a voltage level of cell data using a threshold value of a logic threshold voltage.

18. A nonvolatile ferroelectric memory device having a timing reference control function, comprising:
- a level sensing unit for amplifying a sensing voltage level of cell data high of the main bitline when a sensing enable signal is enabled and a sensing voltage of a main bitline is below a predetermined threshold value;
- a sensing buffer unit for buffering an output voltage of the level sensing unit; and
- a sensing output unit for determining a voltage level of read data read from a nonvolatile ferroelectric memory through a common data bus unit depending on an output voltage of the sensing buffer unit when a sensing output enable signal is enabled.

19. A method for a nonvolatile ferroelectric memory having a timing reference control function, the memory comprising a plurality of cell array blocks and a read/write data register array unit for storing data read/written in the plurality of cell array blocks through a common data bus unit connected in common to the plurality of cell array blocks, comprising the steps of:
- sensing a voltage level of cell data applied from main bitlines of the plurality of cell array blocks;
- amplifying a voltage level of the cell data when the voltage level of the cell data reaches below a sensing critical voltage, and outputting the amplified voltage into the common data bus unit; and
- sensing a voltage level of the amplified voltage on a predetermined time axis for a reference timing strobe interval, and storing an effective value of cell data depending on sensed levels.

20. The method according to claim 19, wherein cell data reaches the sensing critical voltage earlier than row data by a predetermined time when the cell data is high data.

* * * * *